(12) United States Patent
Jung et al.

(10) Patent No.: US 8,853,033 B2
(45) Date of Patent: Oct. 7, 2014

(54) METHOD FOR FABRICATING SEMICONDUCTOR DEVICE

(71) Applicant: Hyundai Motors Company, Seoul (KR)

(72) Inventors: Youngkyun Jung, Seoul (KR); Kyoung-Kook Hong, Hwaseong-Si (KR); Jong Seok Lee, Suwon-si (KR); Dae Hwan Chun, Gwangmyung-si (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/025,776

(22) Filed: Sep. 12, 2013

(65) Prior Publication Data

US 2014/0170824 A1 Jun. 19, 2014

(30) Foreign Application Priority Data

Dec. 18, 2012 (KR) .......... 10-2012-0148600

(51) Int. Cl.
| | | |
|---|---|---|
| *H01L 21/336* | (2006.01) | |
| *H01L 29/423* | (2006.01) | |
| *H01L 29/78* | (2006.01) | |
| *H01L 21/762* | (2006.01) | |
| *H01L 29/66* | (2006.01) | |
| *H01L 21/763* | (2006.01) | |

(52) U.S. Cl.
CPC ...... *H01L 29/66068* (2013.01); *H01L 29/4236* (2013.01); *H01L 29/7813* (2013.01); *H01L 21/76224* (2013.01); *H01L 21/763* (2013.01); *H01L 29/66348* (2013.01); *H01L 29/66734* (2013.01)
USPC ........... 438/270; 438/244; 438/245; 438/259; 438/243; 438/271; 438/272

(58) Field of Classification Search
CPC .............. H01L 29/7813; H01L 29/66734; H01L 29/4236; H01L 29/66348; H01L 21/763; H01L 21/76223; H01L 27/10823; H01L 27/10829; H01L 29/66068
USPC .......... 438/243, 244, 245, 259, 270, 271, 272
See application file for complete search history.

(56) References Cited

U.S. PATENT DOCUMENTS

| | | | |
|---|---|---|---|
| 2003/0032248 A1* | 2/2003 | Yue et al. ...................... | 438/270 |
| 2006/0121676 A1* | 6/2006 | Darwish ....................... | 438/272 |
| 2008/0211015 A1* | 9/2008 | Arena et al. .................. | 257/330 |

*Primary Examiner* — Matthew Reames
*Assistant Examiner* — Farid Khan
(74) *Attorney, Agent, or Firm* — McDermott Will & Emery LLP

(57) ABSTRACT

A method for fabricating a semiconductor device includes: sequentially forming an n− type epitaxial layer, a p type epitaxial layer, and a first n+ region on a first surface of an n+ type silicon carbide substrate; forming a trench by penetrating the first n+ region and the p type epitaxial layer, and etching part of the n− type epitaxial layer; forming a buffer layer in the trench and on the first n+ region; etching the buffer layer to form a buffer layer pattern on both sidewalls defined by the trench; forming a first silicon film on the first n+ region, the buffer layer pattern, and a surface of the n− type epitaxial layer exposed by the trench; oxidizing the first silicon film to form a first silicon oxide film; removing the buffer layer pattern by an ashing process to form a first silicon oxide film pattern; forming a second silicon film on the first silicon oxide film pattern and in the trench; oxidizing the second silicon film to form a second silicon oxide film; and etching the second silicon oxide film to form a gate insulating film within the trench, wherein the first silicon oxide film pattern is positioned on the first n+ region and at the bottom of the trench on the surface of the n− type epitaxial layer.

6 Claims, 6 Drawing Sheets

METHOD FOR FABRICATING SEMICONDUCTOR DEVICE

CROSS-REFERENCE TO RELATED APPLICATION

This application claims priority to and the benefit of Korean Patent Application No. 10-2012-0148600 filed in the Korean Intellectual Property Office on Dec. 18, 2012, the entire contents of which are incorporated herein by reference.

BACKGROUND OF THE DISCLOSURE (a) Field of the Disclosure

The present disclosure relates to a method for fabricating a semiconductor device including silicon carbide (SiC).

(b) Description of the Related Art

With the recent trend toward large-sized and large-capacity application apparatuses, a power semiconductor device having a high breakdown voltage, a high current capacity, and high-speed switching characteristics has become necessary.

Accordingly, much research and development is being conducted on MOSFETs (metal oxide semiconductor field effect transistors) using silicon carbide (SiC), instead of conventional MOSFETs using silicon. Particularly, there is a great deal of development of vertical trench MOSFETs.

In a vertical trench MOSFET, a trench is formed, and then a gate insulating film is formed on the bottom and sides of the trench. A gate insulating film used for a vertical trench MOSFET using silicon carbide is generally a silicon dioxide ($SiO_2$) film formed by oxidizing silicon carbide by oxygen, steam, etc.

Silicon carbide reacts with oxygen, steam, and other gases containing oxygen to form a silicon dioxide film on a surface. Specifically, silicon reacts with oxygen atoms to form a silicon dioxide film, and carbon atoms react with oxygen whereby some of the carbon atoms are vaporized into carbon monoxide (CO) and carbon dioxide ($CO_2$) thereby disappearing, and the remaining carbon atoms are left at the interface between the silicon dioxide film and the silicon carbide.

After forming a gate insulating film, doped polysilicon or a metallic material is deposited in the trench to form a gate electrode.

Anisotropy of the physical properties of silicon carbide exists depending on the orientation of a crystal plane, and the oxidation rate of silicon carbide differs depending on the crystal plane. Thus, in most currently available silicon carbides, a thick gate insulating film, i.e., a silicon dioxide film, is grown on sides of the trench rather than on the bottom of the trench. If there is a relatively large difference in the oxidation rate depending on the crystal orientation, this has a serious adverse effect on the operating characteristics of a vertical trench MOSFET using silicon carbide.

Even when a gate insulating film is formed by a thin film formation process rather than by an oxidation process in order to overcome this issue, the interface characteristics between the gate insulating film and silicon carbide are not good This causes many problems including a degradation of the mobility of a vertical trench MOSFET device using silicon carbide, variations in threshold voltage, etc.

The above information disclosed in this Background section is only for enhancement of the understanding of the background of the disclosure and therefore it may contain information that is not prior art.

SUMMARY OF THE DISCLOSURE

The present disclosure has been made in an effort to provide a method for forming a gate insulating film with a uniform thickness in a silicon carbide MOSFET using a trench gate.

An exemplary embodiment of the present disclosure provides a method for fabricating a semiconductor device, the method including: sequentially forming an n− type epitaxial layer, a p type epitaxial layer, and a first n+ region on a first surface of an n+ type silicon carbide substrate; forming a trench by penetrating the first n+ region and the p type epitaxial layer, and etching part of the n− type epitaxial layer; forming a buffer layer in the trench and on the first n+ region; etching the buffer layer to form a buffer layer pattern on both sidewalls defined by the trench; forming a first silicon film on the first n+ region, the buffer layer pattern, and a surface of the n− type epitaxial layer exposed by the trench; oxidizing the first silicon film to form a first silicon oxide film; removing the buffer layer pattern by an ashing process to form a first silicon oxide film pattern; forming a second silicon film on the first silicon oxide film pattern and in the trench; oxidizing the second silicon film to form a second silicon oxide film; and etching the second silicon oxide film to form a gate insulating film within the trench, wherein the first silicon oxide film pattern is positioned on the first n+ region and at the bottom of the trench on the surface of the n− type epitaxial layer.

The buffer layer may include amorphous silicon, silicon nitride, or amorphous carbon.

The first silicon oxide film may include portions having different thicknesses.

Portions of the first silicon oxide film formed on the first n+ region and at the bottom of the trench on the surface of the n− type epitaxial layer may be thicker than a portion of the first silicon oxide film formed on the sidewalls defined by the trench.

During the oxidization of the second silicon film, silicon carbide on both sidewalls defined by the trench may be oxidized.

The method for fabricating a semiconductor device according to the exemplary embodiment of the present disclosure may further include: after forming the gate insulating film, forming a gate electrode on the gate insulating film; forming an oxide film on the gate insulating film and the gate electrode, and etching part of the first n+ region to form an n+ region; and forming a source electrode on the p type epitaxial layer, the n+ region, and the oxide film, and forming a drain electrode on a second surface of the n+ type silicon carbide substrate.

According to an exemplary embodiment of the present disclosure, a gate insulating film with a uniform thickness can be formed by forming a buffer layer pattern made of a non-oxidizing material on both sidewalls defined by the trench and oxidizing the first silicon film and the second silicon film.

Therefore, it is possible to prevent a defect in the operation of a vertical trench MOSFET using silicon carbide.

DETAILED DESCRIPTION OF EXEMPLARY EMBODIMENTS

Figure 1:
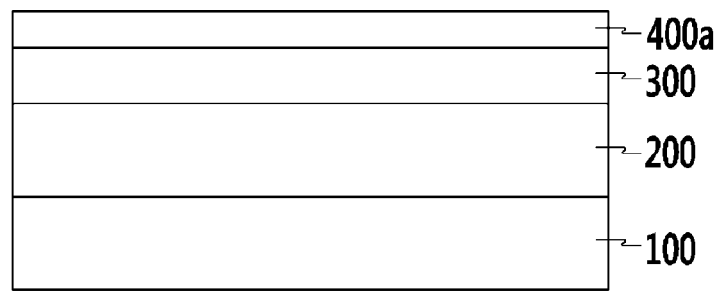
FIGS. 1 to 12 are views sequentially showing a method for fabricating a semiconductor device according to an exemplary embodiment of the present disclosure.

Exemplary embodiments of the present disclosure will be described in detail with reference to the attached drawings.

The present disclosure may be modified in many different forms and should not be construed as being limited to the exemplary embodiments set forth herein. Rather, the exemplary embodiments of the present disclosure are provided so that this disclosure will be thorough and complete, and will fully convey the concept of the present disclosure to those having ordinary skill in the art.

In the drawings, the thickness of layers and regions may be exaggerated for clarity. In addition, when a layer is described to be formed on another layer or on a substrate, this means that the layer may be formed directly on the other layer or directly on the substrate, or that a third layer may be interposed between the layer and the other layer or the substrate so that the layer may be formed indirectly on the other layer or indirectly on the substrate. Like numbers refer to like elements throughout the specification.

Hereinafter, a method for fabricating a semiconductor device according to an exemplary embodiment of the present disclosure will be described in detail with reference to FIGS. 1 to 12.

FIGS. 1 to 12 are views sequentially showing a method for fabricating a semiconductor device according to an exemplary embodiment of the present disclosure.

As shown in FIG. 1, an n+ type silicon carbide substrate 100 is prepared, and an n− type epitaxial layer 200, a p type epitaxial layer 300, and a first n+ region 400a are sequentially formed on a first surface of the n+ type silicon carbide substrate 100.

Figure 2:
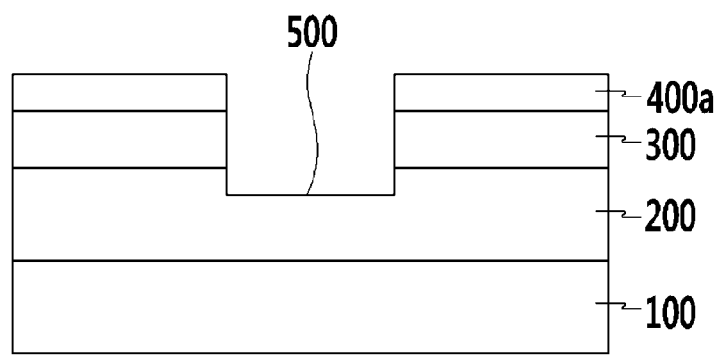

As shown in FIG. 2, a trench 500 is formed by penetrating the p type epitaxial layer 300 and the first n+ region 400a, and etching part of the n− type epitaxial layer 200.

Figure 3:
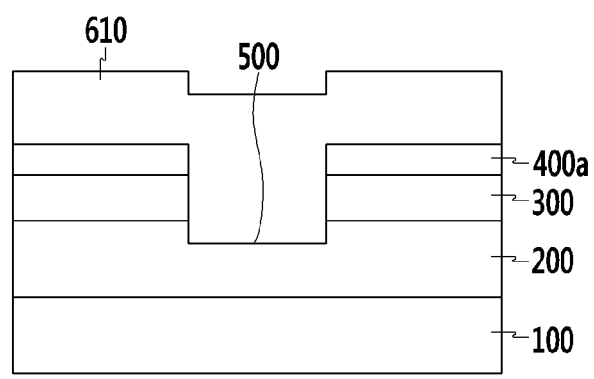

As shown in FIG. 3, a buffer layer 610 is formed in the trench 500 and on the first n+ region 400a. The buffer layer 610 may fill the trench 500. The buffer layer 610 may be made of any non-oxidizing material such as, for example, amorphous silicon, silicon nitride, or amorphous carbon.

Figure 4:
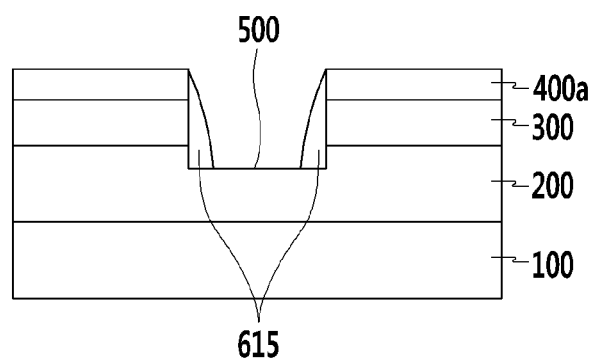

As shown in FIG. 4, the buffer layer 610 is etched to form a buffer layer pattern 615. During the etching, the buffer layer 610 disposed on the first n+ region 400a is removed. The buffer layer pattern 615 is formed on both sidewalls defined by the trench 500 and on a surface of the n− type epitaxial layer 200 exposed by the trench 500 adjacent to the sidewalls.

Figure 5:
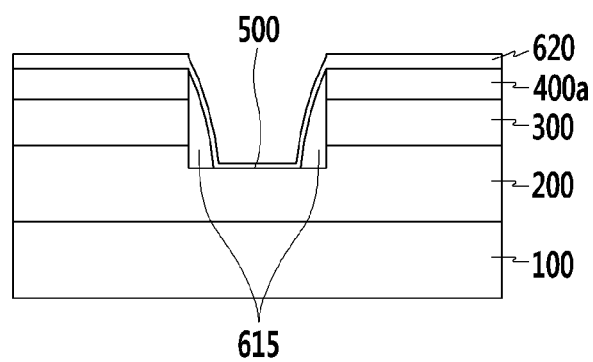
Figure 6:
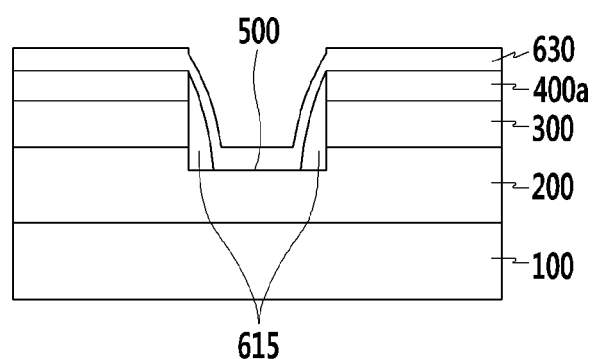

As shown in FIG. 5, a first silicon film 620 is formed on the first n+ region 400a, the buffer layer pattern 615, and the surface of the n− type epitaxial layer 200 exposed by the trench 500. Then, as shown in FIG. 6, the first silicon film 620 is oxidized to form a first silicon oxide film 630.

During oxidation of the first silicon film 620, silicon carbide and the first silicon film 620 are oxidized, thereby forming the first silicon oxide film 630 on the first n+ region 400a and at the bottom of the trench 500 on the surface of the n− type epitaxial layer 200. Because the buffer layer pattern 615 is formed on both sidewalls defined by the trench 500, only the first silicon film 620 formed on the buffer layer pattern 615 is oxidized. Accordingly, the thickness of portions of the first silicon oxide film 630 formed on the first n+ region 400a and at the bottom of the trench 500 on the surface of the n− type epitaxial layer 200 are larger than the thickness of a portion of the first silicon oxide film 630 formed on the sidewalls defined by the trench 500.

Figure 7:
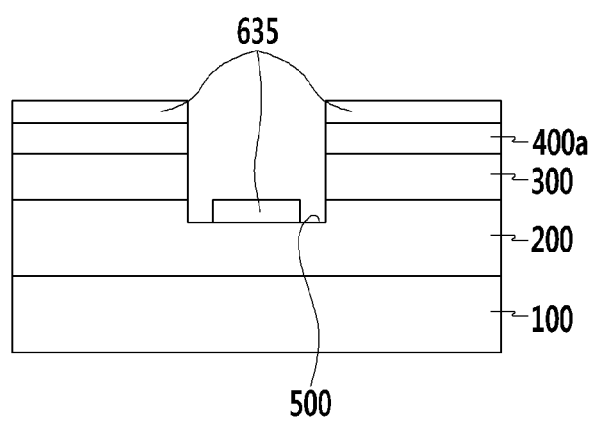

As shown in FIG. 7, an ashing process is performed to remove the buffer layer pattern 615. At this point, the first silicon oxide film 630 formed on the buffer layer pattern 615 is removed to form a first silicon oxide film pattern 635. That is, the first silicon oxide film pattern 635 is positioned on the first n+ region 400a and at the bottom of the trench 500 on the surface of the n− type epitaxial layer 200.

Figure 8:
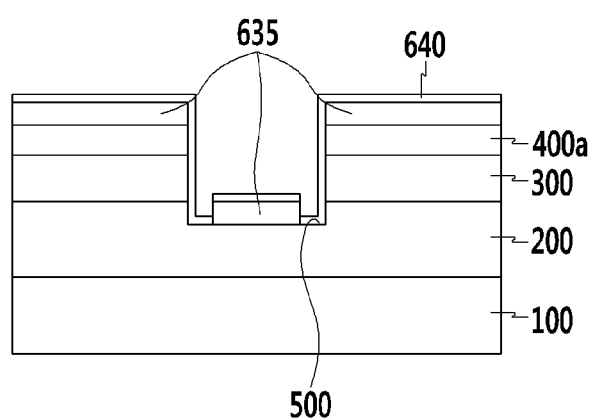
Figure 9:
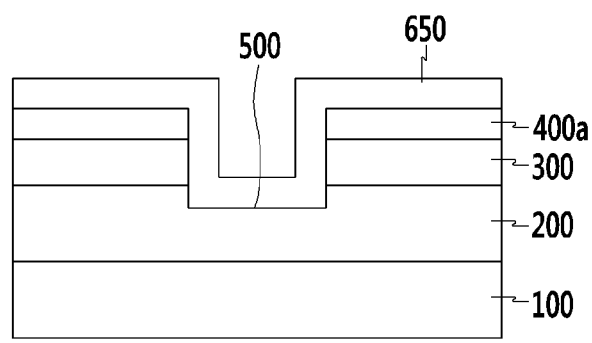

As shown in FIG. 8, a second silicon film 640 is formed on the first silicon oxide film pattern 635 and in the trench 500. Then, as shown in FIG. 9, the second silicon film 640 is oxidized to form a second silicon oxide film 650.

During oxidation of the second silicon film 640, silicon carbide and the second silicon film 640 are oxidized, thereby forming the second silicon oxide film 650 on both sidewalls defined by the trench 500. The second silicon film 640 is oxidized on the first silicon oxide film pattern 635, thus making the thickness of the second silicon oxide film 650 uniform.

Figure 10:
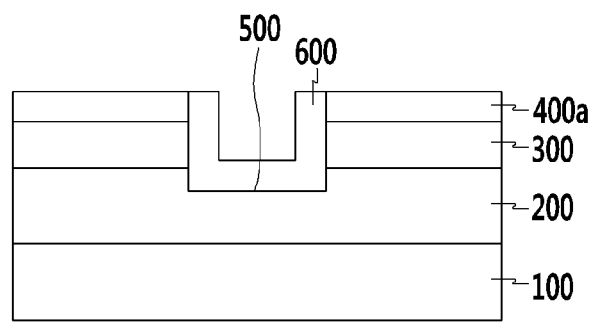

As shown in FIG. 10, the second silicon oxide film 650 is etched to form a gate insulating film 600 with a uniform thickness formed within the trench 500.

According to the present disclosure, it is possible to form a gate insulating film 600 with a uniform thickness by forming a buffer layer pattern 615 made of a non-oxidizing material on both sidewalls defined by the trench 500 and sequentially oxidizing the first silicon film 620 and the second silicon film 640.

Figure 11:
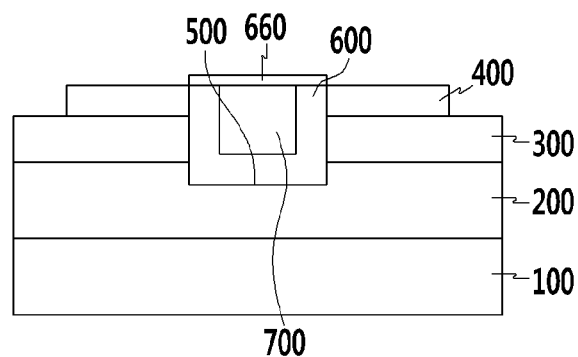

As shown in FIG. 11, a gate electrode 700 is formed on the gate insulating film 600, and an oxide film 660 is formed on the gate insulating film 600 and the gate electrode 700. Then, part of the first n+ region 400a is etched to form an n+ region 400.

Figure 12:
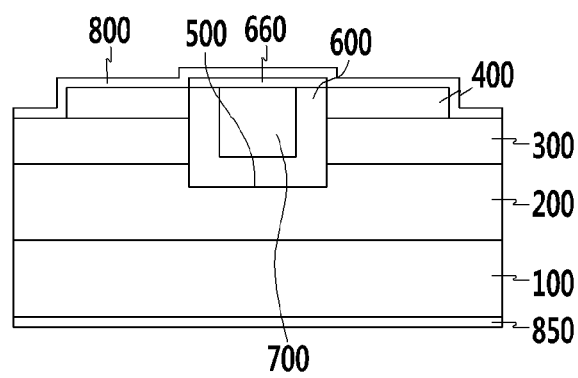

As shown in FIG. 12, a source electrode 800 is formed on the p type epitaxial layer 300, the n+ region 400, and the oxide film 660, and a drain electrode 850 is formed on a second surface of the n+ type silicon carbide substrate 100.

As seen from above, the gate insulating film 600 can be formed with a uniform thickness, thus making it possible to prevent any defect in the operation of the vertical trench MOSFET using silicon carbide.

While this disclosure has been described in connection with what is presently considered to be practical exemplary embodiments, it is to be understood that the disclosure is not limited to the disclosed exemplary embodiments, but, on the contrary, is intended to cover various modifications and equivalent arrangements included within the spirit and scope of the appended claims.

DESCRIPTION OF SYMBOLS

| | |
|---|---|
| 100: n+ type silicon carbide substrate | 200: n− type epitaxial layer |
| 300: p type epitaxial layer | 400: n+ region |
| 500: trench | 600: gate insulating film |
| 610: buffer layer | 615: buffer layer pattern |
| 620: first silicon film | 630: first silicon oxide film |
| 635: first silicon oxide film pattern | 640: second silicon film |
| 650: second silicon oxide film | 660: oxide film |
| 700: gate electrode | 800: source electrode |
| 850: drain electrode | |

What is claimed is:

1. A method for fabricating a semiconductor device, the method comprising: sequentially forming an n− type epitaxial layer, a p type epitaxial layer, and a first n+ region on a first surface of an n+ type silicon carbide substrate;

forming a trench by penetrating the first n+ region and the p type epitaxial layer, and etching part of the n− type epitaxial layer;

forming a buffer layer in the trench and on the first n+ region;

etching the buffer layer to form a buffer layer pattern on both sidewalls defined by the trench;

forming a first silicon film on the first n+ region, the buffer layer pattern, and a surface of the n− type epitaxial layer exposed by the trench;

oxidizing the first silicon film to form a first silicon oxide film;

removing the buffer layer pattern by an ashing process forming a first silicon oxide film pattern;

forming a second silicon film on the first silicon oxide film pattern and in the trench;

oxidizing the second silicon film to form a second silicon oxide film; and etching the second silicon oxide film to form a gate insulating film within the trench, wherein the first silicon oxide film pattern is positioned on the first n+ region and at the bottom of the trench on the surface of the n− type epitaxial layer.

2. The method of claim 1, wherein the buffer layer comprises amorphous silicon, silicon nitride, or amorphous carbon.

3. The method of claim 2, wherein the first silicon oxide film comprises portions having different thicknesses.

4. The method of claim 3, wherein portions of the first silicon oxide film formed on the first n+ region and at the bottom of the trench on the surface of the n− type epitaxial layer are thicker than a portion of the first silicon oxide film formed on the sidewalls defined by the trench.

5. The method of claim 4, wherein, during the oxidization of the second silicon film, silicon carbide on both sidewalls defined by the trench is oxidized.

6. The method of claim 1, further comprising:

after forming the gate insulating film, forming a gate electrode on the gate insulating film;

forming an oxide film on the gate insulating film and the gate electrode, and etching part of the first n+ region to form an n+ region; and forming a source electrode on the p type epitaxial layer, the n+ region, and the oxide film, and forming a drain electrode on a second surface of the n+ type silicon carbide substrate.

* * * * *